SINGLE WIRE CONTROL SYSTEM

Filed Sept. 9, 1968 2 Sheets-Sheet 1

INVENTOR
JOSEPH F. ZIOMEK
BY John R. Faulkner
Glenn S. Arendsen
ATTORNEYS

INVENTOR
JOSEPH F. ZIOMEK
BY
John R. Faulkner
Glenn S. Arendsen
ATTORNEYS

United States Patent Office 3,525,875

Patented Aug. 25, 1970

3,525,875

SINGLE WIRE CONTROL SYSTEM

Joseph F. Ziomek, Livonia, Mich., assignor to Ford Motor Company, Dearborn, Mich., a corporation of Delaware Filed Sept. 9, 1968, Ser. No. 758,362
Int. Cl. B60k 1/12
U.S. Cl. 307—10 16 Claims

ABSTRACT OF THE DISCLOSURE

Integrated circuit amplifiers have their outputs connected to switches applying or interrupting electric power to a vehicle accessory. A feedback circuit connects the output of each amplifier to the base of the amplifier input transistor and each amplifier is preset to oscillate at some predetermined individual frequency. An output terminal of each input transistor is connected to a single wire that is connected to ground through a control module containing individual crystals capable of oscillating at the frequency of each corresponding amplifier oscillator. Switching one of the crystals in the control module into the circuit begins ocsillation of the oscillator having the corresponding frequency and the output of the oscillator actuates the appropriate switch.

SUMMARY OF THE INVENTION

In present day automobiles, a wide variety of remotely located components or accessories are actuated by switches that must be accessible to the vehicle driver. Assembly problems occasioned by the complexity of the wiring system capable of connecting the appropriate switch to the appropriate component in any one car are magnified tremendously by the wide variety of models and optional equipment. Expected future increases in the number of standard and optional accessories raises the variety and complexity of wiring systems to the point where wiring costs and assembly time will represent a significant portion of over-all vehicle cost.

This invention provides a control system that uses a single control wire to connect a plurality of remotely located components with the switches for operating the components. Each component has an electronic oscillator connected thereto so the output of the oscillator operates a switch controlling the application of electrical power to the component. Each oscillator has a different oscillation frequency and each contains a control element that contains oscillation at the oscillator frequency during oscillation. The single control wire connects each control element to a control module. Manually operated switches in the control module connect the control wire to a ground potential through individual impedances, each of which presents a low impedance to ground at a predetermined oscillation from one oscillator frequency and a high impedance to ground at all other frequencies. Coupling the control wire to ground through a low impedance for the frequency of one oscillator turns on that oscillator which then actuates the associated component.

An integrated circuit amplifier is made into an oscillator for this invention by coupling the amplifier output to the base of its input transistor. The input transistor then serves conveniently as the control element, and the single control wire is connected to an output terminal of the input transistor. Piezoelectric crystals having series resonant frequencies corresponding to individual oscillator frequencies produce the actuating impedances in the control module. Voltage for actuating the switch then is taken from the feedback circuit posterior of the feedback crystal.

During automobile assembly, the control wire and a power lead are routed to each loction of a remote component and through the instrument panel area. As components are added to the vehicle, the associated oscillator is connected to the control wire and the power lead. The control module containing the appropriate number and type of crystals is connected to the control wire and installed in the vehicle instrument panel where it is accessible to the vehicle driver. Additional control modules for those accessories requiring control from other locations similarly can be connected to the control wire. Any of the oscillators can be used to control multiple operational modes of a component by connecting feedback circuits providing different oscillating frequencies to switches controlling the different modes and including crystals in the control module corresponding to each frequency.

DETAILED DESCRIPTION

Figure 1:
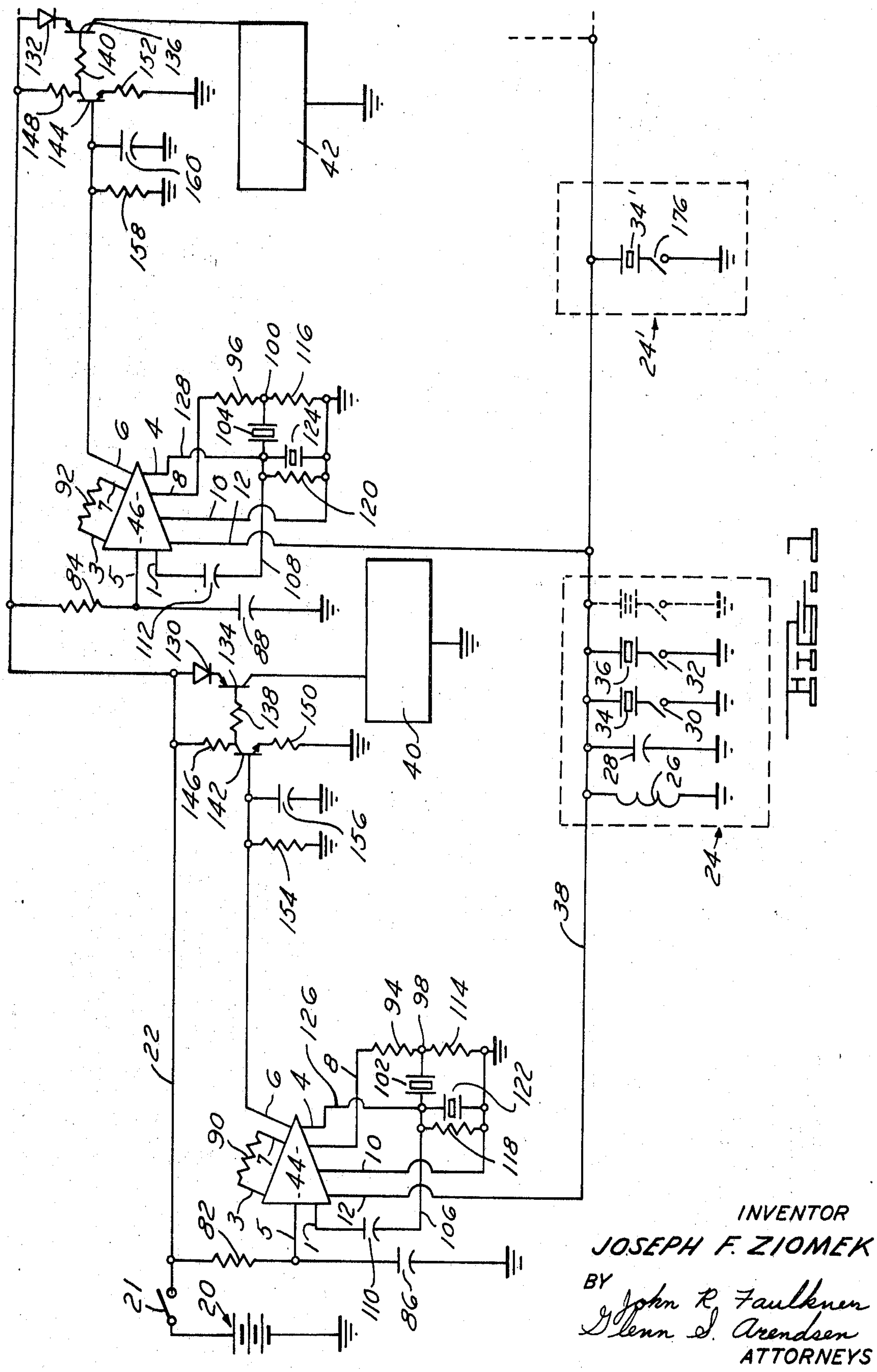
FIG. 1 is a schematic of a control system of this invention showing two remote components. Oscillators made up of integrated circuit amplifiers are shown in the control system.

Referring to FIG. 1, a conventional automobile storage battery 20 has its positive terminal connected through a switch 21 to a power lead 22 and its negative terminal grounded to the vehicle frame. In a control module 24, an inductor 26, a capacitor 28, and switches 30 and 32 also have one side connected to ground. Piezoelectric crystals 34 and 36 are connected in series with switches 30 and 32, respectively, and the other terminals of inductor 26, capacitor 28, crystal 34 and crystal 36 are connected to a control wire 38. Power lead 22 and control wire 38 are routed throughout the vehicle to the locations of each controlled component, two of which are represented by numerals 40 and 42.

Figure 2:
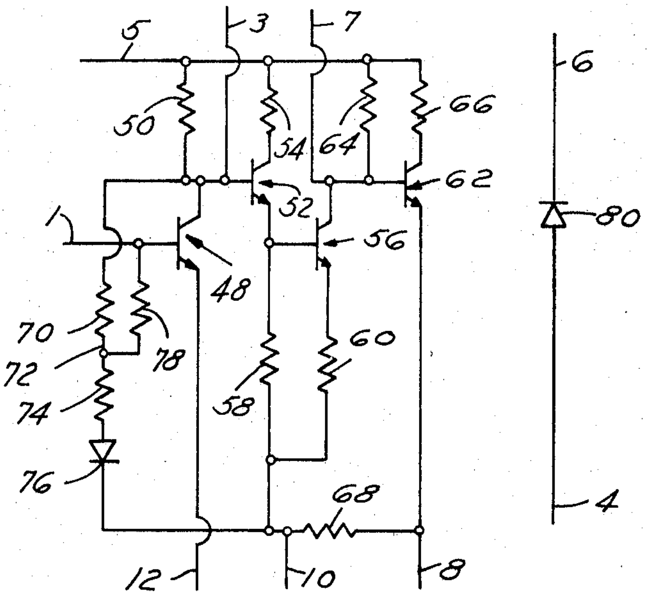
FIG. 2 is a schematic of the circuitry in an integrated circuit amplifier useful in making up the oscillators of FIG 1.

Physically associated with each component 40, 42 is an integrated circuit amplifier 44, 46, respectively. A typical integrated circuit amplifier is type RCA CA3021, the internal circuitry of which is shown in FIG. 2. Referring to FIG. 2, the amplifier has a total of 12 terminals numbered accordingly of which nine are used in this invention. Terminal 1, the input terminal of the amplifier, is connected to the base of an NPN type input transistor 48. The collector of transistor 48 is connected through a resistor 50 to power terminal 5, and the emitter is connected to terminal 12. A second NPN type transistor 52 has its base connected to the collector of transistor 48 and its collector connected through a resistor 54 to power terminal 5. The emitter of transistor 52 is connected directly to the base of a third NPN type transistor 56 and through a resistor 58 to terminal 10.

A resistor 60 connects the emitter of transistor 56 to terminal 10. The collector of transistor 56 is connected to terminal 7 and to the base of a fourth NPN type transistor 62, which is the output transistor. Resistor 64 connects the base of transistor 62 to power terminal 5 and resistor 66 connects the collector of the transistor 62 to power terminal 5. The emitter of transistor 62 is connected to terminal 8 which is connected to terminal 10 by a resistor 68.

Resistor 70 connects the collector of transistor 48 to a lead 72 and resistor 74 connects lead 72 to the anode of a diode 76 that has its cathode connected to terminal 10. A resistor 78 connects terminal 1 to lead 72. Terminal 4 is connected to terminal 6 by a diode 80.

Turning back to FIG. 1, resistors 82 and 84 connect power lead 22 to power terminals 5 of amplifiers 44 and 46, respectively. Capacitors 86 and 88 connect the respective power terminals to ground. Resistors 90 and 92 connect terminals 3 and 7 of the respective amplifier, and control wire 38 is connected to terminal 12 of each amplifier.

Resistors 94 and 96 connect the respective output terminals 8 to circuit terminals 98 and 100. Piezoelectric crystals 102 and 104 connect respective terminals 98 and 100 to leads 106 and 108. Capacitors 110 and 112 connect leads 106 and 108 to respective input terminals 1. Resistors 114 and 116 connect respective terminals 98 and 100 to ground. Resistor 118 in parallel with piezoelectric crystal 122 connect lead 106 to ground and resistor 120 in parallel with piezoelectric crystal 124 connect lead 108 to ground. Terminal 10 of each amplifier also is connected to ground. Respective components 94 through 124 make up the feedback circuits of each amplifier. A lead 126 connects lead 106 with terminal 4 of amplifier 44 and a lead 128 connects lead 108 with terminal 4 of amplifier 46.

The anodes of diodes 130 and 132 are connected to power lead 22 and the cathodes are connected to the respective emitters of power transistors 134 and 136. Transistor 134 has its collector connected to component 40 and transistor 136 has its collector connected to component 42.

Resistors 138 and 140 connect the bases of transistors 134 and 136 to the respective collectors of transistors 142 and 144. A resistor 146 connects the collector of transistor 142 to power lead 22 and a resistor 148 connects the collector of transistor 144 to power lead 22. The emitters of transistors 142 and 144 are connected to ground by resistors 150 and 152, respectively.

Terminal 6 of amplifier 44 is connected to the base of transistor 142, and terminal 6 of amplifier 46 is connected to the base of transistor 144. Resistor 154 and capacitor 156 connect the base of transistor 142 to ground and resistor 158 and capacitor 160 connect the base of transistor 144 to ground.

Resistors 90 and 92 determine the amplification of amplifiers 44 and 46, and the resonant frequencies of crystals 102 and 104 determine the oscillation frequency of the associated oscillator. Crystal 34 is selected so its series resonant frequency equals that of crystal 102 within relatively low limits of preferably less than 0.2 percent, and similarly the resonant frequency of crystal 36 equals that of crystal 104 within such limits. Resonant frequencies of the crystals in the control module preferably differ by at least 4 percent, with the actual difference depending primarily on the number of crystals present.

Inductor 26 passes any DC biasing voltage in lead 38 while presenting a high impedance to the AC voltage. The inductor has an idealized value depending on the number of crystals in the control module. For ten such crystals providing ten frequency channels, inductor 26 is about 40 microhenries while for thirty-two channels, the inductor is 25 microhenries. Values higher than ideal decrease the impedance of the lowest channel frequency when that channel crystal is disconnected while values lower than ideal decrease the impedance of the higher channel frequencies when the lowest channel crystal is connected. The idealized value of the inductor for any preselected number of crystals can be determined empirically.

Typical types and values of the other components useful with a 12 volt battery are: capacitor 28, 500 micro-microfarad; crystals 34, 36, 102, 104, 122 and 124, Clevite Type "TF"; amplifiers 44 and 46, RCA CA3021 integrated circuits; resistors 82 and 84, 620 ohms; capacitors 86 and 88, 0.1 microfarad; resistors 90 and 92, 39K ohms; resistors 94 and 96, 1000 ohms; capacitors 110 and 112, 1000 micro-microfarad; diodes 130 and 132, Motorola 1N4001; transistors 134 and 136, Motorola MPS-6534; resistors 138 and 140, 470 ohms; transistors 142 and 144, Fairchild 2N3569; resistors 146 and 148, 5.6K ohms; resistors 150 and 152, 47 ohms; resistors 154 and

158, 6.8K ohms; and capacitors 156 and 160, 1000 micro-microfarad.

Turning on the vehicle ignition system closes switch 21 to apply a positive potential to the collectors of transistors 48, 52, 56 and 62 (FIG. 2) to the collectors of transistors 142 and 144, and to the emitters of transistors 134 and 136. Assuming that switch 30 is open, a high AC impedance exists between the emitter of transistor 48 of amplifier 44 and ground. Transistor 48 is biased as a class A amplifier and has a low gain under these circumstances, thereby holding the oscillator made up of amplifier 44 in a quiescent state. A DC potential of about 6 volts exists at terminal 8 but crystal 102 blocks the DC potential from reaching input terminal 1 and the base of transistor 142. Transistor 142 and transistor 134 both are nonconducting. By similar analysis, the oscillator made up of amplifier 46 also remains quiescent and transistor 136 does not conduct.

Assuming now that the vehicle operator wishes to actuate component 40, he manually closes switch 30 to connect lead 38 to ground through crystal 34. This drops the AC impedance at the emitter of transistor 48 and increases the transistor gain, thereby precipitating the oscillation of amplifier 44 at the resonant frequency of crystal 102.

Lead 126 transmits the oscillation appearing in lead 106 to diode 80 which rectifies the oscillations into a positive voltage appearing at the base of transistor 142. Transistor 142 switches into conduction and turns on transistor 134 which applies the potential of power lead 22 to component 40. Component 40 is activated to perform the desired operation.

Connecting crystal 34 into the circuit initially presents a low impedance to the emitter of transistor 48 of amplifier 46 also, but because the resonant frequency of crystal 34 differs from the frequency characteristics of crystal 104, amplifier 46 remains quiescent. Closing switch 32 individually or while switch 30 is closed switches crystal 36 into the circuit which turns on the oscillator made up of amplifier 46.

When one of the amplifiers is oscillating, the oscillations of that amplifier are transmitted via lead 38 to the input transistors of the other amplifiers. Amplified versions of these signals can appear at the output terminal 8 of the other amplifiers but the feedback crystals block such amplification from the power switches when the outputs are taken from the feedback circuits posterior of the feedback crystals. By increasing the impedance of crystals 102 and 104 and increasing the resistance of resistors 94 and 114 the grounding crystal 122 can be eliminated.

Power lead 22 and control wire 38 can be connected to additional amplifiers and power transistors as indicated by the dashed extensions in FIG. 1. For each additional amplifier, a crystal having a corresponding resonant frequency in series with a manually operated switch is connected between single wire 38 and ground. Another control module 24' containing a switch 176 in series with a crystal 34' having the same series resonant frequency as crystal 34 can be connected to the control wire 38 at any other location. Closing switch 176 also activates component 40. This feature renders the system particularly adaptable to controlling power windows for example, where module 24 serves as the master control and module 24' is the individual control located adjacent the vehicle window. Similarly, two or more oscillators having the same oscillating frequency can be connected to the single control wire to operate components located in different places but having the same operating requirements.

Figure 3:
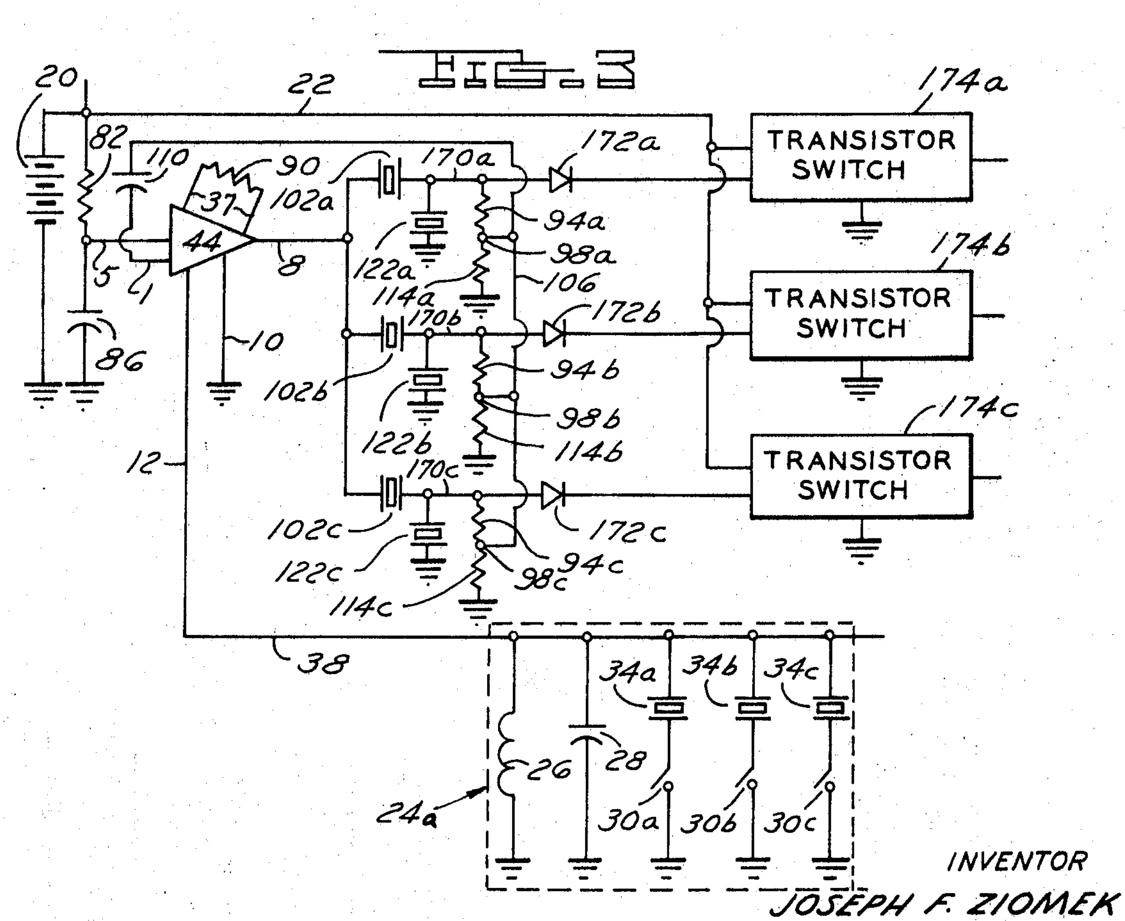
FIG. 3 is a schematic of a circuit using a single oscillator to control a component having three operational modes.

A system using a single oscillator to operate a component having three operating modes is shown in FIG. 3. Such a multi-component oscillator can be used to operate a heater blower motor having low, medium and high speeds, for example. The FIG. 3 system is described below with letter suffixes on the numerals used to designate equivalent elements of amplifier 44 of FIG. 1.

Referring to FIG. 3, control module 24a contains switches 30a, 30b and 30c in series with crystals 34a, 34b and 34c respectively. The same control wire 38 of course connects other oscillators having single control modes such as the oscillator made up of amplifier 46. Crystals 102a, 102b and 102c connect terminal 8 of amplifier 44 to leads 170a, 170b and 170c, respectively. Crystals 122a, 122b and 122c connect leads 170a, 170b and 170c to ground, and resistors 94a, 94b and 94c connect leads 170a, 170b and 170c to terminals 98a, 98b and 98c. Resistors 114a, 114b, 114c connect terminals 98a, 98b and 98c to ground and lead 106 connects each of terminals 98a, 98b and 98c through capacitor 110 to input terminal 1 of amplifier 44.

Diodes 172a, 172b and 172c connect respective leads 170 to transistor switches 174a, 174b and 174c. Each transistor switch 174 contains switching circuitry equivalent to that of transistors 142 and 134 in FIG. 1.

Assuming that the series resonant frequency of crystal 34a equals that of crystal 102a within the previously specified limits, closing switch 30a begins oscillation of the oscillator made up of amplifier 44 at the series resonant frequency of crystal 102a. Diode 172a rectifies the alternating voltage appearing in lead 170a and applies a positive voltage to transistor switch 174a. Switch 174a accordingly applies the voltage of power lead 22 to the heater motor to produce a low motor speed. By similar analysis, closing switch 30b produces oscillation at the series resonant frequency of crystal 102b and actuates switch 174b to operate the blower motor at a medium speed. And oscillating at the frequency of crystal 102c actuates switch 174c to operate the motor at a high speed.

In a typical vehicle installation of the system of the invention, single mode oscillators operate the parking lights, brake lights, back up lights, fuel level indicator, door ajar indicator, starter motor, etc.; dual mode oscillators provide the high and low beam headlight operations and the power window operation; and triple mode oscillators determine the heater-air conditioner-defroster selection and operate the blower motor. Optional accessories such as a convertible top motor are connected into the system as they are needed. The system is completely compatible with the conventional wiring techniques and some of the above components as well as unmentioned components can be conventionally wired. Moreover, two or three complete systems can be used in each vehicle without interference from each other.

Thus the invention provides a system for operating remotely located components that uses a single control wire connected to oscillators associated with each remotely located component. Integrated circuit amplifiers serve conveniently as the basic structure of the oscillators and the input transistor of the amplifier then is used as the oscillator control element. Using carefully matched piezoelectric crystals to determine the oscillation frequency permits the use of numerous control channels in a narrow frequency band.

I claim:

1. A single wire control system for actuating selectively at least two remotely located switches comprising:

an electronic oscillator connected to each switch so oscillation of the oscillator actuates the switch, each of said oscillators being capable of oscillating at a frequency differing from each other oscillator, each of said oscillators having a feedback circuit for returning the oscillations from the oscillator output to the oscillator input, each of said oscillators containing a control element in which oscillation at the respective oscillator frequency is present during oscillation and which will turn off the oscillator when the impedance to the oscillation exceeds a predetermined value, and a single control wire connecting each of said control elements to a control module, said control module containing manually actuated means for reducing selectively the impedance of the control wire to ground at each oscillator frequency to turn on the corresponding oscillator.

2. The control system of claim 1 in which the control element is the input transistor of each oscillator, said feedback circuit being connected to the transistor base terminal, said power supply being connected to one output terminal of the transistor and said single control wire being connected to the other output terminal.

3. The control system of claim 2 in which the control module contains a piezoelectric crystal for each oscillator, said crystals being connected in parallel and each crystal having a low impedance to ground at the oscillating frequency of its corresponding oscillator.

4. The control system of claim 3 in which the feedback circuit of each oscillator comprises a piezoelectric crystal having a series resonant frequency substantially equal to the series resonant frequency of its corersponding crystal in the control module.

5. The control system of claim 4 comprising a rectifying means connected to said feedback circuit on the control element side of the feedback crystal and in which one of the remotely located switches is an electronic switch means coupled to the output of said rectifying means, said switch means being actuated by the rectified voltage from said rectifying means.

6. The control system of claim 5 comprising a fixed inductance in parallel with the crystals in the control module, said inductance presenting a low impedance to DC voltage in the control wire and a high impedance to oscillator AC.

7. The control system of claim 6 comprising a second control module containing at least one crystal connected to said single control wire, said second control module being located remotely from said first control module.

8. The control system of claim 7 in which the second control module contains a crystal having a series resonant frequency substantially equal to the series resonant frequency of one crystal in the first control module.

9. The control system of claim 8 in which at least one of the oscillators has a plurality of feedback circuits, each of the feedback circuits providing a different resonant frequency, each feedback circuit having a switch means connected thereto that is actuated when the oscillator is oscillating at that feedback circuit frequency.

10. The control system of claim 1 in which the feedback circuit of each oscillator comprises a piezoelectric crystal having a series resonant frequency determining the oscillating frequency of the oscillator.

11. The control system of claim 1 comprising a fixed inductance in parallel with the crystals in the control module, said inductance presenting a low impedance to DC voltage in the control wire and a high impedance to oscillator AC.

12. In an automotive vehicle having a source of electrical energy and a plurality of remotely located components operated by the electrical energy under the control of the vehicle driver, a control system for said components comprising:

a switch means physically associated with and connected to each component, a power lead routed through the vehicle to connect the energy source to each switch means, an electronic oscillator physically associated with and connected to each of said switch means, each oscillator having an oscillating state in which it produces oscillations of a frequency differing from the other oscillators and a quiescent state, each of said oscillators actuating its associated switch means to couple the source of electrical energy to the associated component when in one of said states, a single control wire routed through the vehicle and connected to each of said oscillators, and a control module accessible to the vehicle driver, said control module containing means connected to the single control wire for selectively switching individual oscillators from the quiescent state to the oscillating state.

13. The vehicle of claim 12 in which each oscillator has a feedback circuit containing a piezoelectric crystal, the series resonant frequency of said crystal determining the oscillating frequency of its oscillator, and the control module contains piezoelectric crystals having corresponding series resonant frequencies.

14. The vehicle of claim 13 in which each oscillator is made up of an input transistor biased as a Class A amplifier and an output transistor, said feedback circuit connecting an output terminal of the output transistor to the base terminal of the output transistor to the base terminal of the input transistor, said single control wire being connected to an output terminal of the input transistor, said control module containing means for selectively increasing the amplification of each transistor to switch its oscillator into its oscillating state.

15. The vehicle of claim 14 in which each of said switch means is coupled to the feedback circuit of its associated oscillator posterior of the crystal in the feedback circuit.

16. The vehicle of claim 15 in which at least one of the oscillators has a plurality of feedback circuits, each of the feedback circuits providing a different resonant frequency, each feedback circuit having a switch means connected thereto that is actuated when the oscillator is oscillating at that feedback circuit frequency.

No references cited.

JOHN KOMINSKI, Primary Examiner

U.S. Cl. X.R.

307—140; 317—138, 146, 148.5; 331—49, 116, 161, 162